United States Patent
Erdeljac et al.

(10) Patent No.: US 6,534,364 B1
(45) Date of Patent: Mar. 18, 2003

(54) TUNNEL DIODE LAYOUT FOR AN EEPROM CELL FOR PROTECTING THE TUNNEL DIODE REGION

(75) Inventors: John P. Erdeljac, Plano, TX (US); Louis N. Hutter, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1059 days.

(21) Appl. No.: 08/949,826

(22) Filed: Oct. 14, 1997

Related U.S. Application Data

(60) Continuation of application No. 08/741,414, filed on Oct. 29, 1996, now abandoned, which is a continuation of application No. 08/476,167, filed on Jun. 7, 1995, now abandoned, which is a division of application No. 08/347,998, filed on Dec. 5, 1994, now abandoned.

(51) Int. Cl.[7] .......................................... H01L 21/8247
(52) U.S. Cl. ...................................... 438/264; 438/981
(58) Field of Search ............................... 438/257–267, 438/981

(56) References Cited

U.S. PATENT DOCUMENTS

| | | | | |
|---|---|---|---|---|
| 4,363,109 A | * | 12/1982 | Gardner, Jr. | 365/94 |
| 4,398,338 A | * | 8/1983 | Tickle et al. | |
| 5,086,008 A | * | 2/1992 | Riva | 437/41 |
| 5,103,425 A | * | 4/1992 | Kuo et al. | 365/226 |
| 5,132,239 A | * | 7/1992 | Ghezzi et al. | 437/43 |
| 5,322,803 A | * | 6/1994 | Cappelletti et al. | 437/27 |
| 5,411,908 A | * | 5/1995 | Santin et al. | 437/52 |

* cited by examiner

Primary Examiner—Richard Booth
(74) Attorney, Agent, or Firm—Warren L. Franz; Wade James Brady, III; Frederick J. Telecky, Jr.

(57) ABSTRACT

A tunnel diode construction 12 for an EEPROM device 10, and method for making it are shown. A tank 13 is provided at a surface of a semiconductor substrate 5 containing a doped diffused tunnel region 46. A layer of insulation 38 is provided over the surface of the substrate with a first thickness 48 to provide a tunnel oxide over at least part of the tunnel region and a second, larger, thickness 39 elsewhere. A conducting floating gate 19 is provided above the doped diffused tunnel region 46 and at least part of the tank 13, on the layer of insulation 38. The floating gate 19 extends over the oxide 38 beyond the lateral boundaries of the doped diffused tunnel region 46 in every direction to terminate over the second thickness of oxide 39 over the tank 13. To complete the EEPROM device 10, an MOS transistor 15 having source 21 and drain 27 doped regions provided in the substrate 5, with a portion 29 of the floating gate 19 capacitively coupled to a control gate 25 and extending over at least part of a channel region 28 of the MOS device.

12 Claims, 3 Drawing Sheets

TUNNEL DIODE LAYOUT FOR AN EEPROM CELL FOR PROTECTING THE TUNNEL DIODE REGION

This application is a continuation of application Ser. No. 08/741,414, Oct. 29, 1996 now abandoned; which is a continuation of application Ser. No. 08/476,167, filed Jun. 7, 1995 now abandoned; which is a division of application Ser. No. 08/347,998, filed Dec. 5, 1994 now abandoned.

BACKGROUND OF THE INVENTION

1. Field of the Invention

This invention relates to improvements in EEPROM devices, and methods for making the same, and more particularly to improvements in the layout and construction of the floating gate of an EEPROM cell with respect to the tunnel region of the EEPROM cell, and methods for making the same; and still more particularly to improvements in a tunnel diode for conducting charge to and removing charge from a floating gate of an EEPROM device, and method for constructing the same.

2. Relevant Background

As advances are made in technologies related to electrically erasable read-only memory (EEPROM) devices, EEPROM devices are being introduced into many semiconductor processes, such as CMOS, BiCMOS, linearBiCMOS™, and other advanced semiconductor processes. When EEPROM cells are produced for any process, factors contributing to improving the ability to manufacture such EEPROM devices, and the potential impact of such factors on reliability of the final devices, are of key concern.

Many EEPROM designs rely upon an associated tunnel diode to control the placement and removal of a charge onto and from the floating gate of the device, which controls the apparent threshold voltage of an associated MOS transistor. The charge on the floating gate is related to the charge that has passed through the tunnel diode. The tunnel diode typically is constructed with a doped tunnel diode region contained in the semiconductor substrate in which the EEPROM device is formed. The tunnel diode region is separated from the floating gate by a thin oxide layer, sometimes called the "tunnel oxide." Among the many considerations that affect the design and construction of the tunnel diode region, the thickness and quality of the tunnel oxide are of basic importance. In previous EEPROM devices, the tunnel oxide generally has a thickness of about 100 Å, and the quality of tunnel oxide impacts the reliability and performance of the final EEPROM cell.

Although the floating gate must overlie the tunnel region for the tunnel read and write mechanisms properly to operate, in the past, the typical layout of an EEPROM cell provided for the extents of the floating gate layer to intersect the extents of the tunnel diode region. Consequently, the floating gate only partially, or just, covered the tunnel diode region, but did not fully encompass it. Thus, the exposed portions of the tunnel region and the portions of the tunnel region at or immediately below the margins of the floating gate were susceptible to overetching. This was especially true during the floating gate etch steps or in subsequent semiconductor manufacturing processes. Such overetching, of course, may result in degraded EEPROM cell reliability.

Also in the past, in the formation of a tunnel diode in association with a MOS transistor, a first portion of a gate oxidation was performed to provide an initial oxide thickness over the tunnel diode region and its peripheral areas. Thicker field oxide may also have been concurrently formed over more highly doped regions of the substrate at which field adjust implants may have been made. The oxide directly over the tunnel region was then stripped to expose the substrate, and a dopant of appropriate type and conductivity to provide the desired tunnel region was introduced or implanted into the substrate. The exposed substrate area was then again oxidized to produce the proper tunnel oxide thickness, about 100 Å. The surrounding oxide was also concurrently thickened, for example to a final thickness of about 200 Å to 500 Å.

After the tunnel region and oxidation had been completed, a polycrystalline silicon (polysilicon) floating gate was deposited, patterned, and etched. As mentioned, the floating gate was formed entirely within the tunnel oxide region, although the tunnel region implant typically extended to beneath the thicker peripheral gate oxide. This process may be performed in conjunction with the formation of a control gate in a dual polysilicon EEPROM cell, or independently in a single or dual polysilicon EEPROM cell.

In any event, a point exists in the process at which an etch is required to etch the floating gate, desirably which will stop on the underlying thin tunnel oxide. However, during such etching steps, stopping the etch exactly at the tunnel oxide level has been difficult to perform, and generally some overetch occured. The overetch may remove some of the tunnel oxide under the floating gate at its edges. Sometimes, the overetch extended completely through the tunnel oxide beyond the margins of the floating gate and into the tunnel region in the substrate. Such overetch is problematic, since although with future oxidations the overetched regions will regrow the removed oxide, the quality of the regrown oxide could be degraded. This may result in altered performance or reliability. In some case, if the overetch was severe, the reliability of the final EEPROM cell was compromised, and the ability to perform and repeat the process is questionable.

An additional concern is that some contaminants, such as etch residues, may be present in the areas near the tunnel region. These contaminants could affect the regrowth of the oxide, or simply by being present, degrade the reliability of the EEPROM cell. Also, these exposed regions may also be exposed to other etch processes later in the process. This increases the possibility of further silicon etch. This suggests that this approach is not ideal with respect to its ability to be successfully performed.

SUMMARY OF THE INVENTION

Considering the above, therefore, it is an object of the invention to provide an improved EEPROM device and method for making the same.

It is another object of the invention to provide an improved EEPROM structure and method for making the same that results in a device, which has increased reliability with respect to data retention and write/erase endurance, compared with EEPROM cells in which the floating gate does not completely overlap the tunnel region.

It is another object of the invention to provide an improved EEPROM structure and method for making the same that results in a device that has relaxed manufacturing requirements, without affecting the performance of the device.

It is yet another object of the invention to provide an improved tunnel diode construction for use with an EEPROM of the type in which a tunnel diode is employed to charge and discharge a floating gate in the EEPROM, and method for making the tunnel diode.

These and other objects, features and advantages of the invention will be apparent to those skilled in the art from the following detailed description of the invention, when read with the accompanying drawings and appended claims.

This invention provides a layout technique by which a floating gate of an EEPROM cell can be constructed to overlie completely the tunnel diode region, thereby eliminating an exposed region of tunnel oxide. The invention enables a more manufacturable and repeatable floating gate etch, and eliminates the potential for subsequent processing steps to affect the tunnel diode area. Besides these manufacturability issues, the invention positively influences the reliability of the final EEPROM cell.

According to a broad aspect of the invention, a floating gate design is presented for use in an EEPROM cell structure constructed in a semiconductor substrate of first conductivity type. In the floating gate design, a first doped region of second conductivity type has a first doping concentration to provide a tank at a surface of the substrate. A second doped region is provided in the tank at the surface of the substrate to provide a tunnel region. The second doped region is of second conductivity type and has a second doping concentration more than the first doping concentration. A layer of insulation is provided over the surface of the substrate, having a first thickness to provide a tunnel region over at least part of the doped region, and a second, larger, thickness elsewhere. A conducting floating gate is provided above the second doped region and at least part of the first doped region on the layer of insulation. The floating gate extends laterally beyond the lateral boundaries of the second doped region in every direction, and has at least one side within lateral boundaries of the tank, extending over the thicker portion of the layer of insulation.

According to another broad aspect of the invention, a method is presented for making a floating gate in an EEPROM cell construction process. The method includes forming a first doped region in a semiconductor substrate of first conductivity type. The first doped region is of a second conductivity type, and has a first doping concentration to provide a tank at a surface of the substrate. A second doped region of second conductivity type is formed with a second doping concentration more than the first doping concentration to provide a tunnel region in the tank at the surface of the substrate. A layer of insulation is formed over the surface of the substrate with a first thickness to provide a tunnel region over at least part of the second doped region and a larger, thickness elsewhere. A floating gate that can hold an electrical charge, such an polysilicon, is provided above the second doped region and at least part of the first doped region on the layer of insulation. The floating gate extends laterally beyond lateral boundaries of the second doped region in every direction, and has at least one side within lateral boundaries of the tank, extending over the thicker portion of the layer of insulation.

According to another broad aspect of the invention, an EEPROM cell is provided. The EEPROM cell has a tank region in a semiconductor substrate, the tank region being of different conductivity from that of the substrate. A tunnel region in the tank region is of the same conductivity type as the tank. A layer of tunnel insulation, such as a silicon oxide, overlies the tank and tunnel region. The layer of insulation has a first thickness, such as about 100 Å, over at least part of the tunnel region, and a thickness, such as about 200 Å or more, larger than the first thickness elsewhere. A floating gate of conducting material, such as polysilicon, is located above the tunnel region, the floating gate being sized to extend beyond the channel in all directions. The floating gate completely overlies the insulation of first thickness, and at least partially overlies the insulation of greater thickness. Transistor source, drain, and channel regions of the different conductivity type are formed in the substrate, with part of the floating gate lying over the channel. A layer of control gate insulation is formed over at least a portion of the floating gate and channel, and a control gate is formed over the channel and control gate insulation.

According to yet another broad aspect of the invention, a method is presented for making an EEPROM cell. The method includes forming a tank in a semiconductor substrate of different conductivity from the substrate. A tunnel region of the same conductivity type as the tank is formed in the tank. A layer of insulation is formed over the tank and tunnel region. The layer of insulation has a first thickness over at least part of the tunnel region, and a thickness larger than the first thickness elsewhere. For example, the layer of insulation may be a layer of silicon oxide of thickness of about 100 Å over the tunnel region, and about 200 Å or more elsewhere. A floating gate of a conductive material such as polysilicon is formed above the tunnel region, sized to extend beyond the tunnel region in all directions. Transistor source, drain, and channel regions are formed in the substrate with part of the floating gate overlying the channel.

BRIEF DESCRIPTION OF THE DRAWING

The invention is illustrated in the accompanying drawings, in which.

In the various drawings, like reference numerals are used to denote like or similar parts. Additionally, the drawings are not necessarily drawn to scale.

DETAILED DESCRIPTION OF THE PREFERRED EMBODIMENTS

It should be noted that the process steps and structures herein described do not necessarily form a complete integrated circuit device, or a process flow for manufacturing integrated circuits. It is anticipated that the present invention may be practiced with integrated circuit fabrication techniques currently used in the art, and only so much of the commonly practiced process steps are included as are necessary for an understanding of the present invention.

Figure 1:
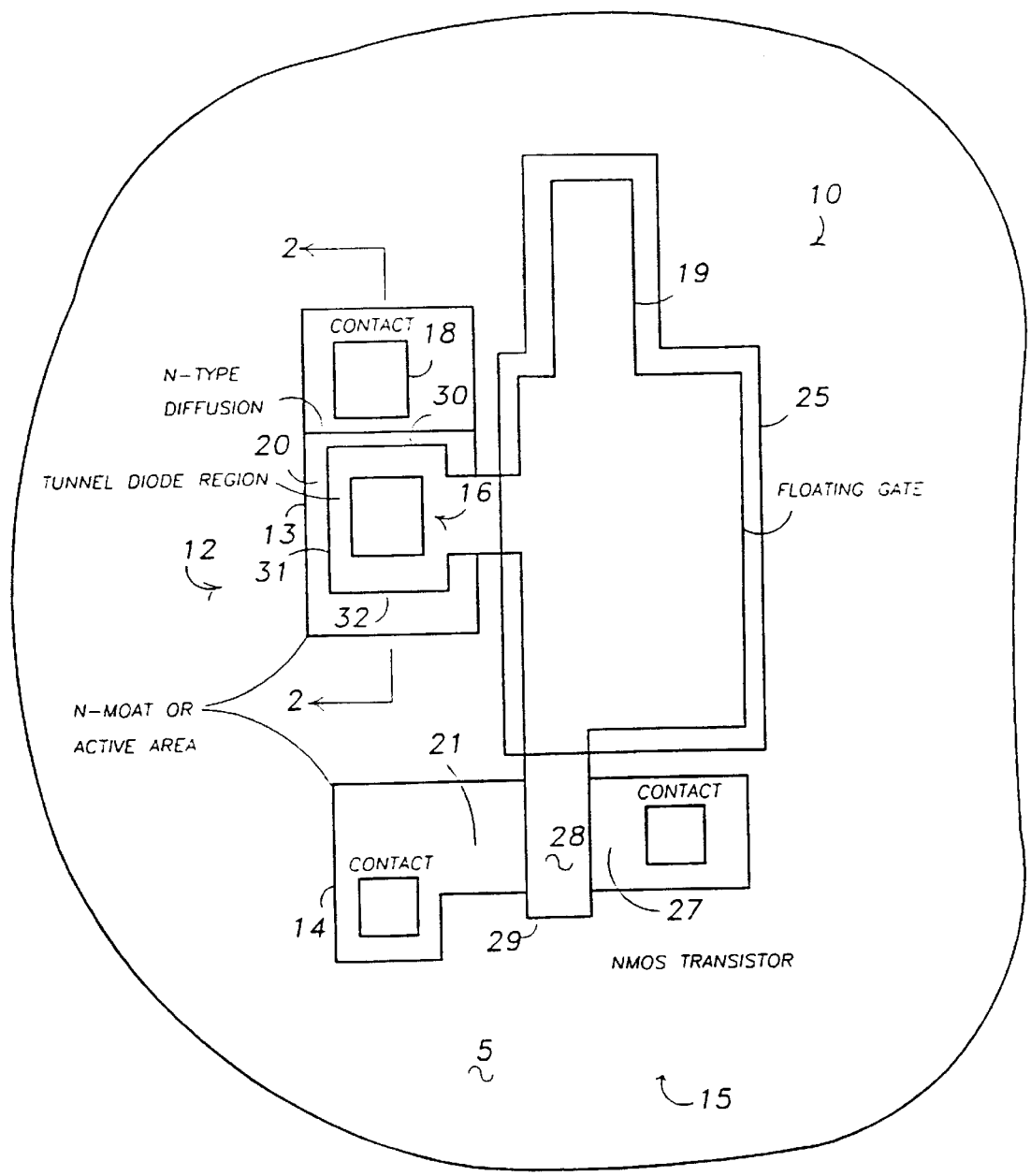
FIG. 1 is a top view of part of a semiconductor substrate in which an EEPROM device has been formed, according to a preferred embodiment of the invention.

FIG. 1 shows a top view of part of a semiconductor substrate 5 in which an EEPROM device 10 has been formed, according to a preferred embodiment of the invention. The structure shown in FIG. 1 has been selected to illustrate one device layout that may be employed in practicing the present invention, but it is to be noted that other layouts may be equally advantageously employed, as will be apparent to those skilled in the art.

The EEPROM device 10 is described in conjunction with an NMOS transistor, although devices of other conductivity types can be also fabricated using the techniques described herein. The EEPROM device 10 is constructed in a silicon substrate 5 of p type conductivity, with two active or moat regions 40 and 14 of n type conductivity formed therein. A tunnel diode 12 is formed in the first moat region 40, and an NMOS transistor 15 is formed in the second moat region 14. An n tank 13 is formed in the moat region 40 as part of diode 12. A contact 18 is constructed adjacent the n tank 13 in moat region 40 for carrying current to and from the tunnel diode to control the charge on a floating gate 19. It should be noted that the n tank 13 insures that an electrical disconnect between the tunnel diode region 16 and the adjacent contact 18 does not occur.

It should be also noted that in the embodiment illustrated, an n tank 13 in moat region 40 is described, although any n type region defined independently from the active regions can be used. The exact location and size of the n tank region 13 with respect to other doped regions in the active area depends on the junction depth of the active region, and misalignment tolerances. The particular position of the n tank or moat region 13 selected for illustration in FIGS. 1 and 2d, for example, demonstrates the invention, but does not necessarily represent any optimal location. Also, it should be noted that the area of the n tank or moat region 13 that contains the tunnel diode region 16 does not necessarily need to be separate from the n tank or moat region 14 that contains the NMOS transistor, below described, although two separate regions are shown in the embodiment illustrated.

The floating gate 19 of the EEPROM device 10 is the element which holds a charge for controlling the threshold of the associated NMOS transistor 15. The shape of the floating gate 19 is not notable, except as described herein, the primary consideration being that the floating gate 19 should present a sufficient size to provide a satisfactory capacitive coupling to the control gate 25 for the NMOS transistor 15.

The tunnel diode 12 includes an n+ doped tunnel diode region 46 (herein the "tunnel region") within the moat region 40, below a rectangular tab portion 20 of the polysilicon floating gate 19, and a thin oxide layer 48 (best seen in FIG. 2d) of about 100 Å thickness between the n+ doped diffused tunnel region 46 and the polysilicon floating gate 19. As can be seen, the elements of the tunnel diode region 16 are completely enclosed or protected beneath the polysilicon floating gate 19, and more particularly, in the embodiment shown, the rectangular tab portion 20 of the polysilicon floating gate 19. The actual location of the tunnel diode region 16 is not of critical importance; in some embodiments, for example, the tunnel diode region may be located directly beneath the central body of the polysilicon floating gate 19.

At least one highly doped region 24 (best seen in FIG. 2d) may be provided, for example, self-aligned with the edges of the rectangular tab portion 20 of the polysilicon floating gate 19. However, due to the extensions of the polysilicon floating gate that lie beyond the periphery of the tunnel diode region 16, electrical continuity may not exist between the contact 18 connection to the highly doped region and the doped diffused tunnel region 46. This emphasizes the importance of the n tank region 13 in such cases, to enable the n type regions 24 on at least one side of the rectangular tab portion 20 of the polysilicon floating gate 19 to establish a connection to the doped diffused tunnel region 46 via the n tank region 13.

It can be seen that for the layout shown in FIG. 1, during fabrication, when a floating gate etch is performed, the edges 30–32 of the rectangular tab portion 20 of the polysilicon floating gate 19 overlying the tunnel diode region 16 will have the same thickness of oxide 39 (see FIG. 2d) under them as all other active areas. Therefore, the standard floating gate etch (polysilicon etch) commonly used in a non-EEPROM process can be used. Since exposed oxides do not vary in thickness, no additional constraints exist upon the selectivity of a standard polysilicon etch process. If any overetch does occur, excessive or not, it will not affect the tunnel oxide region since the tunnel oxide 48 is fully within the perimeter on all sides 30–32 of the extension 20 of the floating gate 19. By virtue of the tunnel oxide protection provided by the polysilicon floating gate, the EEPROM cell 10 of the invention is more manufacturable, and has improved reliability.

In the embodiment shown, an NMOS transistor 15 is associated with the EEPROM device 10. The NMOS transistor 15 is formed in the moat region 14, having n+ type source 21 and drain 27 regions on each side of a channel region 28. A portion 29 of the floating gate 19 extends over the channel 28, separated from the channel by the gate oxide (not shown) or other gate dielectric. The control gate 25, separated from the floating gate by a second layer of dielectric (not shown), which may be, for example, a silicon oxide, a silicon nitride, or combination of both, is capacitively coupled to the floating gate 19 to control the current flow in the channel 28, as known in the art.

Figure 2A:
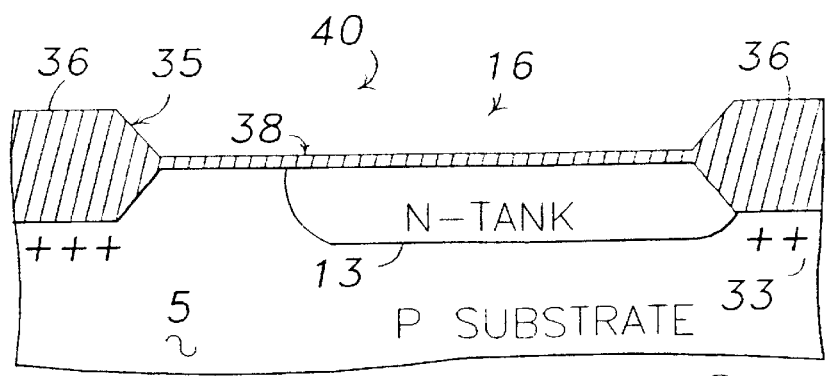
FIGS. 2a–2d are cross-sectional views taken at 2—2 in FIG. 1, showing the steps used in the formation of the tunnel diode region of the EEPROM device of FIG. 1, according to a preferred embodiment of the invention.

The process for making the EEPROM device 10, and more specifically, the tunnel diode 12 for transferring charge to and from the floating gate 19 of the EEPROM device, is shown in the sequence of cross-sectional views of FIGS. 2a–2d, taken at 2—2 in FIG. 1. With reference first to FIG. 2a, the n tank region 13 is formed in the active or moat region 40, and the heavily doped channel stop or field regions 33 are formed, preferably by implanting a p type dopant into the regions of the silicon substrate 5 surrounding the active region 40 for containing the desired device, in a manner known in the art. The implantation dose is adjusted to provide heavily doped implanted regions of p+ type conductivity, for isolation of the EEPROM 10, with other various structures that may be formed in the substrate 5, and for field threshold adjustment.

Although the formation of the n tank region 13 may be performed before the oxidation step, it may be formed by an additional masking and implant operation at any point in the process before the formation of the floating gate. Moreover, as previously mentioned, the n tank region 13 overlaps the tunnel diode region 16 to ensure electrical contact later in the process, the overlap being dependent on junction depths and misalignment tolerances. One advantage realized by the n tank region 13 is that it is an already existing diffusion level in a typical CMOS or BiCMOS process, and will therefore not add any additional processing steps to form. The doping level used for the n tank region 13 may be such that the surface concentration of dopant is approximately the same as that of the substrate 5, to promote a level oxidation growth, in the next described step. As mentioned, this diffusion ensures electrical contact between the n+ type active area 24, below described, and the n+ type tunnel region 46.

Next, a layer of silicon oxide layer 35 varies, as shown, ultimately to provide a thicker layer 36 over the heavily doped p+ type regions 33, and a thinner layer 38 elsewhere. Additional processing below described will cause the oxide layer 38 to become thicker from its initial thickness, which may be, for example, initially about 100 Å–250 Å, but finally about 200 Å–250 Å.

Figure 2B:
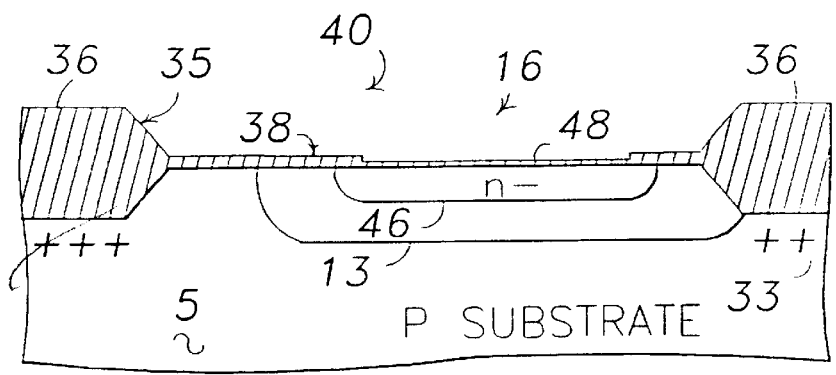
Figure 2C:
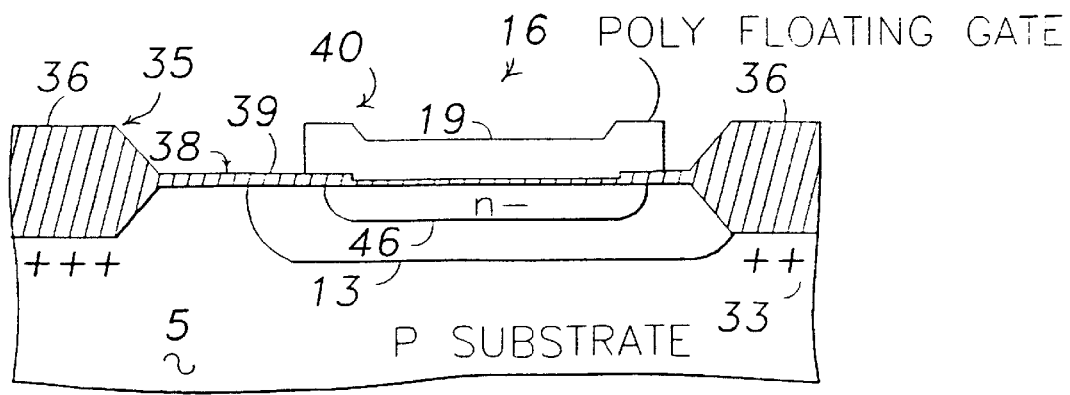

With reference now to FIG. 2b, a doped diffused tunnel region 46 is next performed. A mask (not shown) is located over the oxide layer 38 in the active or moat region 40, the oxide is stripped to the surface of the substrate 5, and an n type dopant is implanted to provide the dopant within the n tank region 13 that will ultimately form the doped diffused tunnel region 46. The implanted dopant is then diffused into the substrate to the desired depth, as shown. The oxide layer 38 is then subjected to a further oxidation growth process, reforming the oxide over the doped diffused region tunnel 46 to a final thickness 48 of about 100 Å and to a final thickness 39 of about 200 Å–500 Å elsewhere. The oxide within the moat 40 of 38 second thickness 39 may provide the gate dielectric for the associated NMOS transistor 15, shown in FIG. 1, for example.

Next, the polysilicon floating gate 19 is deposited, patterned, and etched. As noted, the portion of the polysilicon floating gate that forms a part of the tunnel diode is configured such that it extends beyond the thin tunnel oxide 48 and over into the surrounding thicker oxide 39, as shown. Although the extent of the overlap of the polysilicon floating gate over the thicker oxide 39 is not critical, it should be sufficiently large to ensure that an etch of the oxide region 38 cannot operate to underetch the polysilicon floating gate 19 in the regions of the tunnel oxide 48, yet not be so large as to conceal the n tank region 13, so that contact can still be made to the doped diffused tunnel region 46. Within these limits, the floating gate overlap may depend on misalignment tolerances between the tunnel diode region 16 and the floating gate 19. Therefore, if any overetch occurs within the floating gate etch process, it will not affect the area in which the tunneling current used to program and erase the EEPROM cell occurs. Therefore, the tunnel region is protected from immediately successive processing steps, and, moreover, is protected from any future processing that could affect the manufacturability or reliability of the EEPROM cell.

Thus, in contrast to the prior art in which the tunnel oxide was exposed next to the sidewalls of the floating gate, the exposed oxide 38 in the active moat region 40 is all the same thickness 39, that being the gate oxide thickness. Therefore, the tunnel diode area is now internal to and within the footprint of the floating gate.

Figure 2D:
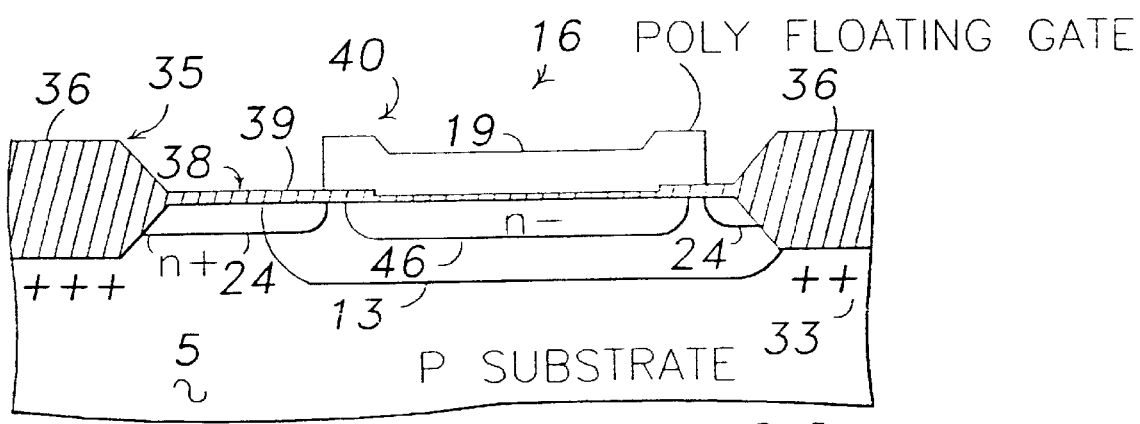

As shown, with reference now to FIG. 2*d*, n+ active regions 24 are implanted, self-aligned with the edges of the polysilicon floating gate 19. Thus, it can be seen that the n tank region 13 ensures electrical contact between the n+ type regions 24 in the active or moat region 40 and the doped diffused tunnel region 46. If the n tank 13, or an analogous n type region, were not present, the tunnel region 46 may be electrically isolated, and the EEPROM cell may not properly operate.

It should be noted that although the invention is described in the context of semiconductor structures having certain conductivity type, and of certain materials, the particular materials and conductivity types disclosed are only exemplary, and that those skilled in the art will recognize that other types of materials having the same or different conductivity types may be equally advantageously employed. For example, the invention can be carried out on semiconductors other than silicon, can have either n-type or p-type dopants, can have various doping levels, etc.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for making a floating gate in an EEPROM cell construction process, comprising the steps of:

(a) providing a semiconductor substrate of first conductivity type;

(b) forming a first doped region of second conductivity type in said semiconductor substrate having a first doping concentration to provide a tank at a surface of said substrate;

(c) forming in said tank and at the surface of said substrate a second doped region of second conductivity type having a second doping concentration greater than said first doping concentration;

(d) forming a layer of insulation over the surface of said substrate having a first thickness to provide a tunnel region over at least a portion of said second doped region and a greater thickness over any remaining portion of said second doped region and elsewhere; and (e) forming said floating gate of a material capable of holding an electrical charge above said second doped region and at least a portion of said first doped region on said layer of insulation, said floating gate extending laterally beyond lateral boundaries of the second doped region in every direction, at least a portion of said floating gate extending over said larger thickness of said layer of insulation.

2. The method of claim 1 wherein said step of forming a layer of insulation comprises forming an oxide layer completely over the second doped region.

3. The method of claim 2 wherein said step of forming a layer of insulation comprises forming said layer of insulation over said tunnel region with a thickness of about 100 Å, and forming said layer of insulation elsewhere with a thickness of greater than 200 Å.

4. The method of claim 1 wherein said step of forming a floating gate comprises forming the floating gate of polysilicon.

5. The method of claim 2 wherein said step of forming said floating gate comprises forming the floating gate to cover entirely the first thickness of insulation and extend laterally in all directions out partially over onto the larger thickness of insulation.

6. The method of claim 1 wherein said first doped region and said substrate have substantially the same doping concentration.

7. A method for making an EEPROM cell, comprising the steps of:

(a) providing a substrate of predetermined conductivity type;

(b) forming a tank region in said semiconductor substrate of different conductivity type from said substrate;

(c) forming a tunnel region in said tank region of the same conductivity type as said tank region;

(d) forming a layer of insulation overlying the tank region and tunnel region, said layer of insulation having a first thickness over at least a portion of the tunnel region, and a second thickness greater than said first thickness over any remaining portion of said tunnel region and elsewhere;

(e) forming said floating gate above the tunnel region, said floating gate being sized to extend laterally beyond the tunnel region in all directions;

(f) forming transistor source, drain, and channel regions in said substrate with said channel region underlying at least a portion of said floating gate; and (g) forming a control gate capacitively coupled to said channel region through said floating gate.

8. The method of claim 7 wherein said step of forming a layer of insulation comprises forming a layer of insulation with a thickness of about 100 Å over said at least a portion of said tunnel region, and a thickness of between about 200 Å and 500 Å elsewhere.

9. The method of claim 7 wherein said step of forming a layer of insulation comprises forming said layer of insulation as a layer of silicon oxide.

10. The method of claim 7 wherein said step of forming said floating gate comprises forming said floating gate of polysilicon.

11. The method of claim 7 wherein said step of forming said floating gate comprises forming said floating gate to completely overlie the first thickness of insulation, and extend laterally in all directions out to partially overlie the larger thickness of insulation.

12. A method for making a floating gate in an EEPROM cell construction process, comprising the steps of:

(a) providing a semiconductor substrate of first conductivity type;

(b) forming a first doped region of opposite conductivity type in said semiconductor substrate having a doping concentration substantially the same as said substrate to provide a tank at a surface of said substrate;

(c) forming entirely within said tank and at the surface of said tank a second doped region of opposite conductivity type having a second doping concentration greater than said first doping concentration;

(d) forming a layer of insulation over the surface of said substrate, said first doped region and said second doped region having a first thickness over at least a portion of said second doped region to provide a tunnel region in said second doped region over at least a portion of said second doped region, said layer of insulation having a greater thickness over any remaining portion of said second doped region and elsewhere; and (e) forming said floating gate of a material capable of holding an electrical charge above said second doped region and at least a portion of said first doped region on said layer of insulation, said floating gate extending laterally beyond lateral boundaries of the second doped region in every direction, at least a portion of said floating gate extending over said larger thickness of said layer of insulation.

* * * * *